United States Patent [19]

Cocconi

[11] Patent Number: 5,060,112

[45] Date of Patent: Oct. 22, 1991

[54] ELECTRICAL COMPONENT ASSEMBLY WITH HEAT SINK

[76] Inventor: Alan G. Cocconi, 725 S. Scottdale Ave., Glendora, Calif. 91740

[21] Appl. No.: 503,252

[22] Filed: Apr. 2, 1990

[51] Int. Cl.⁵ ............................................. H05K 7/20
[52] U.S. Cl. ................................... 361/386; 165/185; 357/81; 361/388
[58] Field of Search ................ 62/418; 165/80.2, 80.3, 165/80.4, 80.5, 104.33, 185; 211/41; 357/79, 81, 82; 361/382–388, 395, 399, 415; 174/16.3

[56] References Cited

U.S. PATENT DOCUMENTS

| | | | |
|---|---|---|---|
| 4,288,839 | 9/1981 | Prager | 357/81 |
| 4,605,986 | 8/1986 | Bentz | 361/386 |
| 4,707,726 | 11/1987 | Tinder | 357/81 |
| 4,923,179 | 5/1990 | Mikolajczak | 165/80.3 |
| 4,972,294 | 11/1990 | Moser, Jr. | 361/386 |

*Primary Examiner*—Gerald P. Tolin
*Attorney, Agent, or Firm*—Pretty, Schroeder, Brueggemann, & Clark

[57] ABSTRACT

An electrical component assembly includes a printed circuit board with a plurality of power transistors mounted in parallel, spaced-apart rows, a longitudinally-extending heat sink, and a longitudinally-extending leaf spring that presses the transistors into contact with the heat sink, thereby providing heat conduction from the transistors to the heat sink. The assembly is provided by placing two parallel rows of transistors between two parallel, spaced-apart walls of the heat sink, sliding two longitudinally-extending leaf springs into the space between the rows of transistors, and then inserting a longitudinally-extending spring spacer between the two leaf springs. The spring spacer compresses the leaf springs against the power transistors, urging the transistors into heat-conducting contact with the walls of the heat sink. Each spacer can be provided with a tapered nose for easier assembly, and the springs can be provided with vertical cuts at intervals equal to the spacing of the transistors, for providing independent force components against individual transistors.

8 Claims, 1 Drawing Sheet

ELECTRICAL COMPONENT ASSEMBLY WITH HEAT SINK

BACKGROUND OF THE INVENTION

1. Field of the Invention

This invention relates generally to an electrical component assembly with a heat sink and to a method for providing the assembly, and more particularly, to an electrical component assembly in which a plurality of power transistors mounted on a printed circuit board are thermally connected to a heat sink.

2. Description of the Related Art

Many electrical component assemblies have components, such as power transistors, that generate excessive heat that must be dissipated to avoid degradation to their performance and reliability. The power transistors are generally provided in one or more rows on a circuit board, in physical contact with a heat sink.

Heat sinks of this kind typically include a longitudinally-extending, generally flat mounting surface to which a flat portion of each power transistor is fastened. One or more cooling vanes or ribs typically extend away from the mounting surface. The vanes are typically placed in a location where they will be exposed to open air or to a circulating cool air flow. Because the cooling vanes present an extended surface area to the cool air, the vanes generally will have a lower average temperature than the mounting surface of the heat sink. Because of the temperature differential between the mounting surface and the cooling vanes, heat generated by the transistors is drawn from the transistors to the mounting surface and in turn to the vanes, where it is transferred to the cool air. The heat sink thereby draws out the heat and reduces the temperature of the power transistors from what it otherwise would be.

Power transistors typically have a body portion with at least one generally planar surface. The power transistors are placed in thermal contact with the heat sink by physically attaching them at their planar surface to the heat sink using screws that pass through a mounting flange of the transistor, or through a mounting hole in the transistor body portion itself, and into the heat sink mounting surface. The necessity for physically attaching the power transistors to the heat sink slows down the process of producing the component assembly, and also slows down any disassembly that might be required later. Furthermore, it is usually necessary to provide space for mounting flanges and access to the mounting screws, making the component packaging spatially inefficient.

It should therefore be appreciated that there is a need for a component assembly with power transistors in thermal contact with a heat sink, but with easier assembly and disassembly of the component parts and with more efficient packaging. The present invention fulfills this need.

SUMMARY OF THE INVENTION

The present invention provides an electrical component assembly, having power transistors mounted to a circuit board and extending therefrom, wherein a spring force is continuously applied to press together the power transistors and an adjacent heat sink, to facilitate thermal conduction from the power transistors to the heat sink, but without the need for physically attaching the transistors to the heat sink. The force pressing the transistors and heat sink together is provided by a spring assembly that presses the generally flat body portions of the power transistors into contact with a mounting surface of the heat sink, thereby creating an efficient thermal conduction path.

Two parallel rows of power transistors can be continuously pressed against two parallel heat sink mounting surfaces by a single spring assembly that comprises two longitudinally-extending springs separated by a longitudinally-extending spring spacer. The springs present an elongated curved surface extending between the rows of power transistors, and the intermediate spring spacer presses outwardly against the springs to compress them and thereby apply a spring force to press the transistors and heat sink surfaces together.

Each longitudinally-extending spring may be provided with one or more longitudinally-extending bends or curved surfaces, against which the spring spacer presses. The most convenient process for assembling the spring assembly is to first position the power transistors adjacent the heat sink surfaces, then slide a pair of the springs between the two parallel rows of power transistors, and finally slide the spring spacer between the two springs, compressing the springs and applying a spring force against the body portions of the transistors. Cooling air passing over the heat sink will then conduct heat away from the power transistors, cooling them. Each spring may be provided with a plurality of vertical cuts to avoid coupling the compressive forces in one area of the spring to adjacent areas of the spring, which could result in unequal pressures on the various transistors and unsatisfactory heat conduction.

The present invention reduces the amount of time required to assemble and disassemble an electrical component assembly. The present invention also increases the packing density of the power transistors, because it eliminates the need to provide space for fastening screws and mounting flanges. Therefore, the transistors can be placed closer together. These advantages not only decrease production costs, but can also increase the conditions under which electrical power is useful, to include conditions previously considered too small or lightweight.

Other features and advantages of the present invention will be apparent from the following description of the preferred embodiment, taken in conjunction with the accompanying drawings, which illustrate, by way of example, the principles of the invention.

DESCRIPTION OF THE PREFERRED EMBODIMENTS

The following description of the present invention is not to be taken in a limiting sense, but is made merely for the purpose of illustrating the general principles of the invention. The description is of the best presently contemplated modes of carrying out the present invention.

Figure 1:
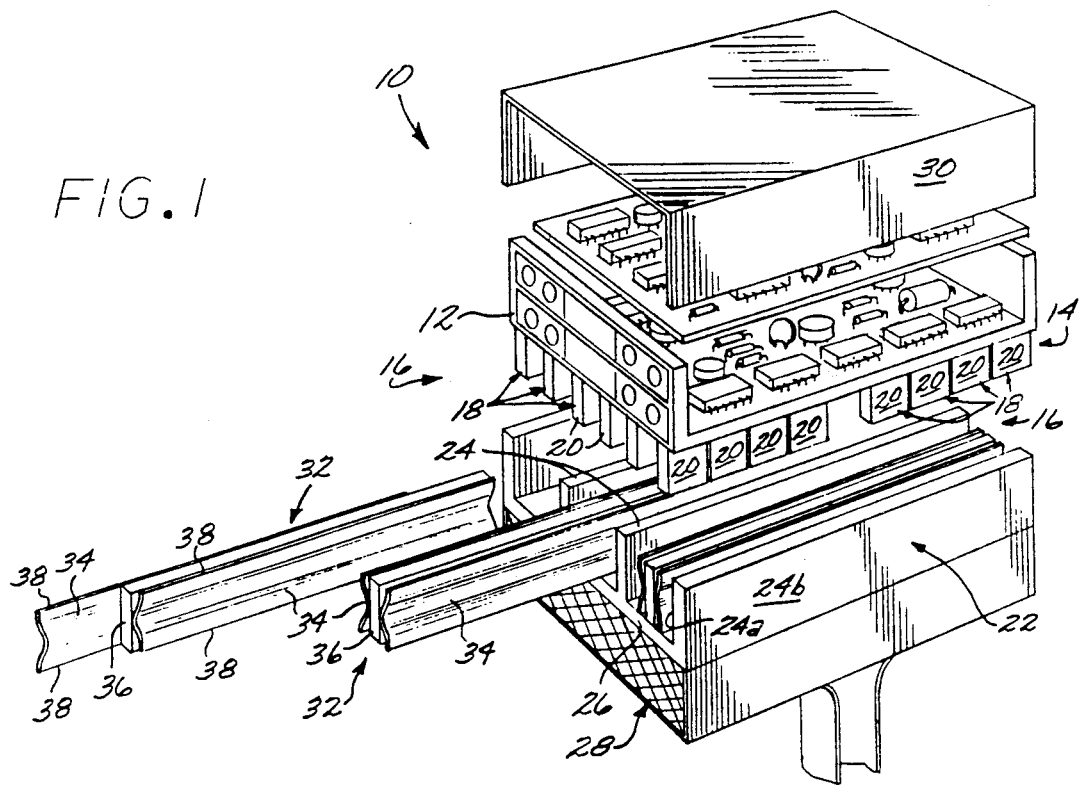
FIG. 1 is an exploded perspective view of an electrical component assembly in accordance with the present invention.
Figure 2:
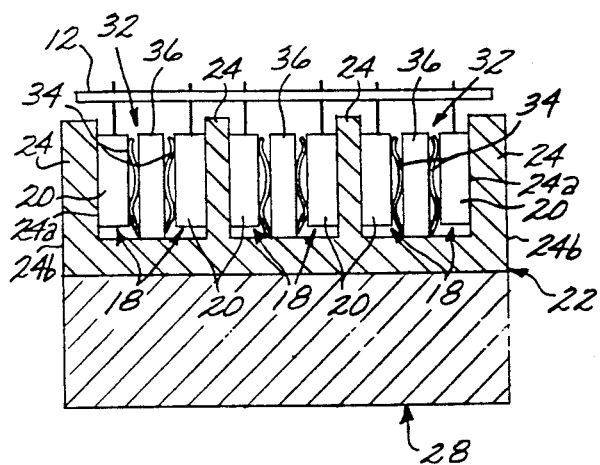
FIG. 2 is a cross-sectional view of the electrical component assembly of FIG. 1.

An electrical component assembly 10 in accordance with the present invention, illustrated in FIGS. 1 and 2, includes a printed circuit board 12 with a plurality of electrical components 14, including power transistors 16, mounted on it. The transistors are mounted on the board in parallel rows, each transistor having a body portion 18 extending vertically away from the board. As known to those skilled in the art, the body portions 18 of the transistors are mounted on the board 12 by thin electrical leads (not illustrated) having an inherent amount of flexibility. Each power transistor body has a generally planar surface 20 oriented generally perpendicular to the board.

The electrical component assembly 10 further includes a heat sink 22 having a plurality of spaced-apart, parallel, longitudinally-extending walls 24. The walls have two parallel flat surfaces 24a and 24b, and are connected to each other at a lateral portion 26 of the heat sink. The walls and lateral portion form a channel space for the transistors 16, and are generally made from a rigid, heat-conductive material. The heat sink is exposed at the lateral portion to a circulating cool air flow, for example, through a honeycomb heat exchanger 28. The cool air draws heat from the lateral portion, creating a temperature differential between the lateral portion and the heat sink walls 20 and thereby causing heat conduction to the lateral portion from the walls. Thus, the lateral portion 26 acts in a similar fashion to a conventional heat sink cooling vane. An assembly cover 30 sinking is placed over the circuit board 12, protecting the electrical components 14.

The transistors 16 are suspended in rows from the circuit board 12 such that their body portions 18 extend into the channel spaces between parallel heat sink walls 24. In particular, the transistors are distributed on the circuit board such that two rows of transistors are suspended in each channel space, as shown most clearly in FIG. 2. A plurality of spring assemblies 32 are also located in the channel spaces between the parallel heat sink walls, resting on the lateral portion 26. The spring assemblies each include two longitudinally-extending springs 34 separated by an elongated spacer 36. Each spring is a thin strip of metal that is curved in cross-section, with two parallel, longitudinally-extending peripheral edges 38. The illustrated springs are constructed from spring steel or a beryllium copper alloy.

When the power transistors 16 are first suspended between the walls 24 of the heat sink 22, a space or gap remains between each row of power transistors and its respective adjacent heat sink wall surface. Thus, the transistors and the heat sink walls are not in direct physical contact and there is little or no heat conduction between them. A pair of the springs 34 are then slid into the longitudinally-extending space between two adjacent rows of the power transistors. Because the springs are not compressed at this point, the springs slide freely into position. While the springs are in this uncompressed condition, the transistors and heat sink walls still are not in direct physical contact. Next, an elongated spacer 36 is forced into position between each pair of longitudinally-extending springs. The spacer is a rigid, longitudinally-extending beam that, when forced between the springs, presses them against the power transistors 16 with a spring force dependent on the spring curvature and composition. This spring force is selected to be about ten pounds on each transistor, but typically can be up to about fifty pounds without causing damage to the transistors. Thus, the springs act as leaf springs compressed by the action of sliding the spacer between them, urging the transistor body portions 18 toward the walls 24.

The act of sliding a spring spacer 36 between each pair of springs 34 simultaneously presses the flat surfaces 20 of all of the transistors 16 in the associated two rows against the heat sink walls 24a and 24b. This contact provides a path for the conduction of heat from the transistors to the heat sink walls and to the lateral portion 26 of the heat sink, thereby cooling the transistors.

Figure 4:
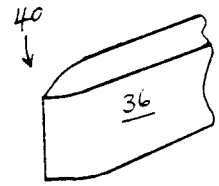
FIG. 4 is an alternative embodiment of the spacer shown in FIG. 1.

For easier assembly, the width of the insertion end 40, or nose, of the spacers 36 can be tapered, as illustrated in FIG. 4. This eliminates the sharp corner that would otherwise be present from a squared off nose, which might tend to catch on the edge of the springs 34, and makes it easier to insert the spacer into the longitudinally-extending space between the springs 34. This allows the spacer to be easily inserted between the springs and to gradually urge them apart.

If each spring 34 is provided as a continuous elongated piece, with some compositions of springs and because of variations in transistor body thickness, it might be that the effect of pressing against a transistor at one segment of the spring can adversely affect the force from other segments of the spring. For example, the spring might be bowed at a particular segment due to pressing against a slightly-oversized transistor at another spring segment, and this bowed area or reaction force from the transistor could also create a wave or elsewhere in the spring, distorting the force applied against the transistors at each of those segments. This could result in insufficient contact of the transistors with the heat sink for effective heat transfer, causing deficient cooling.

Figure 3:
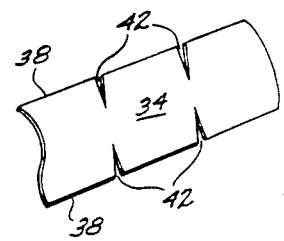
FIG. 3 is a perspective view of an alternative embodiment of the spring shown in FIG. 1.

Therefore, each spring 34 can be provided with a plurality of transverse, or vertical, cuts 42, at spaced intervals along the spring's peripheral edge 38, as illustrated in FIG. 3. The cuts define segments of the spring that will not be adversely affected by the other spring segments, but which will independently apply a force against the transistors. The cuts are located so as to be between adjacent power transistors when the spring assemblies are properly positioned, thereby effectively decoupling the spring segments for the adjacent transistors. The cuts preferably extend into the spring only so far as to decouple the spring segments, typically $\frac{1}{4}$ to $\frac{1}{3}$ of the spring height. If the cuts are provided along the peripheral edges 38 at intervals equal to the spacing between the power transistors, the force from the spring to each transistor will be independent of the force from the other segments. Alternatively, the cuts can be provided at intervals that coincide with clusters of transistors or other uneven transistor packaging intervals. The cuts may be positioned, for example, to decouple a segment of spring adjacent a group of transistors having a first thickness from a group of transistors having a second thickness.

The embodiments described above allow power transistors to be placed in heat-conducting contact with a heat sink without physically mounting the transistors to it. An elongated spring applies a force that simultaneously presses all the transistors and the heat sink together. The transistors not need to be physically attached to the heat sink, as by screws or other fastening devices. Therefore, no mounting flanges or threaded screw openings are required in the transistors or the heat sink. After the transistors are mounted to a circuit board in rows, it is necessary only to suspend the body of the transistors between walls of the heat sink and slide a spring assembly into the space between the rows. By a single action, the spring assembly continuously urges the transistors and heat sink walls into heat conducting contact, without sink, transistor by transistor. Thus, the present invention provides a faster means of assembling power transistor assemblies with heat sinks, and provides more compact and efficient packaging of the power transistors.

The present invention has been described above in terms of a presently preferred embodiment so that an understanding of the present invention may be conveyed. There are, however, many configurations for electrical component assemblies not specifically described herein, but with which the present invention is applicable. For example, although not generally practical, the heat sink walls could be made somewhat flexible rather than rigid, and the spring assemblies could be made to press outwardly against the heat sink walls, moving the walls into contact with the transistors. Also, the invention can be applied to electronic devices other than transistors, such as rectifiers and resistors, that extend from a circuit board. The present invention should therefore not be seen as limited to the particular embodiments described herein, but rather, it should be understood that the present invention has wide applicability with respect to electrical component assemblies. Such other configurations may be achieved by those skilled in the art in view of the descriptions herein. Accordingly, the scope of the invention is best defined by the following claims.

I claim:

1. An electrical component assembly comprising:
   a longitudinally-extending heat sink;
   a plurality of spaced-apart electrical components mounted on a printed circuit board, each component having a body portion extending outwardly therefrom; and
   spring means for pressing the electrical components and heat sink into heat-conducting contact;
   wherein the heat sink includes at least one longitudinally-extending wall, and the spring means presses the component body portions against the wall and comprises an elongated longitudinally-extending spring that is curved in cross-section;
   wherein the heat sink further includes a longitudinally-extending second wall opposite the one heat sink wall, thereby forming a channel into which the electrical components are suspended; and
   wherein the spring means further includes a slidable and removable spacer beam that compresses the elongated spring against the electrical components.

2. An assembly as recited in claim 1, wherein:
   the spring means further comprises a pair of leaf springs separated by the spacer beam.

3. An assembly as recited in claim 1, wherein the spring includes a plurality of cuts defining spring segments along the longitudinal edges of the spring, thereby decoupling the spring segments such that each segment independently presses the electrical components against the heat sink wall.

4. An assembly as recited in claim 1, wherein the spacer beam has a tapered nose end.

5. An assembly as recited in claim 1, wherein the spring is made from spring steel.

6. An assembly as recited in claim 1, wherein the force applied by the spring on each electrical component is approximately 10 pounds.

7. An electrical component assembly comprising:
   a plurality of electrical components placed in a row and having coplanar vertically-extended surfaces;
   a heat sink having a first wall parallel to the vertical surfaces of the electrical components, said heat sink also having a second wall and a laterally-extending cooling vane adjoining the walls; and
   spring means for urging the heat sink wall and the vertically extending surfaces of the electrical components into heat-conducting contact, wherein the spring means comprises
   a longitudinally-extending leaf spring having a curved surface, and
   a longitudinally-extending slidable and removable spring spacer between the walls pressing laterally on the curved surface of the leaf spring, whereby the spring applies a spring force against the electrical components.

8. An electrical component assembly comprising:
   a plurality of electrical components placed in a row and having coplanar vertically-extending surfaces;
   a heat sink having a first wall parallel to the vertical surfaces of the electrical components and a laterally-extending cooling vane adjoining the wall; and
   spring means for urging the heat sink wall and the vertically extending surfaces of the electrical components into heat-conducting contact, wherein the spring means comprises
   a first longitudinally-extending curved surface,
   a second longitudinally-extending curved surface parallel to the first curved surface, and
   a longitudinally-extending slidable and removable spring spacer pressing laterally on the first and second curved surfaces;
   wherein the heat sink further includes a second wall parallel with the first wall such that the first wall, second wall, and cooling vane define a channel into which two parallel rows of electrical components are suspended; and
   wherein the spring means is located between the two parallel rows of electrical components, thereby simultaneously pressing the components against the first and second heat sink walls.

* * * * *

UNITED STATES PATENT AND TRADEMARK OFFICE
CERTIFICATE OF CORRECTION

PATENT NO. : 5,060,112

DATED : October 22, 1991

INVENTOR(S) : Alan G. Cocconi

It is certified that error appears in the above-identified patent and that said Letters Patent is hereby corrected as shown below:

In column 4, line 30, after "a wave or" insert --hump--.

In column 4, line 64, before "not need" insert --do--.

In column 5, line 6, after ", without" insert --the need for attaching each transistor to the heat --.

Signed and Sealed this

Twenty-third Day of February, 1993

Attest:

STEPHEN G. KUNIN

*Attesting Officer*    Acting Commissioner of Patents and Trademarks